(12) United States Patent
Wang et al.

(10) Patent No.: US 6,449,158 B1
(45) Date of Patent: Sep. 10, 2002

(54) METHOD AND APPARATUS FOR SECURING AN ELECTRONIC POWER DEVICE TO A HEAT SPREADER

(75) Inventors: Ying Wang, Wheeling, IL (US); Clark D. Fischbach, Woodstock, IL (US); Robert A. Richter, Jr., Lake in the Hills, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/027,040

(22) Filed: Dec. 20, 2001

(51) Int. Cl.[7] .................................................. H05K 7/20
(52) U.S. Cl. ..................... 361/704; 361/705; 361/707; 361/719; 361/761; 257/706; 257/720; 228/262.2; 165/80.3; 165/185
(58) Field of Search ........................ 361/704, 705–708, 361/715, 717–719, 761; 257/706, 707, 712, 720; 228/262.9, 123.1; 165/80.3, 185; 29/832, 840

(56) References Cited

U.S. PATENT DOCUMENTS 5,332,695 A * 7/1994 Shigihara et al. ........ 228/123.1
5,561,321 A * 10/1996 Hirano et al. ................ 257/700
5,675,474 A * 10/1997 Nagase et al. ............... 165/185
5,786,633 A * 7/1998 Wolfgang et al. ........... 257/706
6,046,907 A * 4/2000 Yamaguchi .................. 156/145
6,081,426 A * 6/2000 Takeda et al. ............... 165/185
6,188,579 B1 * 2/2001 Buondelmonte et al. .... 257/707

* cited by examiner

*Primary Examiner*—Boris Chervinsky
(74) *Attorney, Agent, or Firm*—Steven A. May

(57) ABSTRACT

An electronic control module 100 is provided wherein a power device 102 is secured to a rigidizer, or heat spreader, 110 such that a thermally conductive path is created for a conduction of heat from the power device to the rigidizer. A thermally conductive and electrically insulated interface 208, preferably anodized aluminum, is disposed between device 102 and rigidizer 110 and is solder bonded to each of the device and the rigidizer, facilitating the creation of a thermal path from the device to the rigidizer. In order to solder bond the device to the interface and the interface to the rigidizer, solderable coatings 206, 210, 214 are respectively applied to the surfaces 207 and 209 of the interface and surface 215 of the rigidizer.

15 Claims, 2 Drawing Sheets

METHOD AND APPARATUS FOR SECURING AN ELECTRONIC POWER DEVICE TO A HEAT SPREADER

FIELD OF THE INVENTION

The present invention relates generally to electronic circuits that include power devices, and, in particular, to mounting a power device to a heat spreader.

BACKGROUND OF THE INVENTION

Engine mounted electronic control units for vehicular engines are subject to a high level of heat and vibration. Performance of the electronic components and a circuit substrate included in engine mounted electronic control units is often limited or impaired due to these conditions. In addition, electronic power devices, such as power transistors, dissipate energy in the form of heat when operating in an electronic control unit. The high ambient temperatures of an engine mounted electronic control unit in combination with the heat dissipated by an electronic power device imposes a thermal constraint on the operation of the device, since excessive operating temperatures can reduce device longevity and can damage the device. As a result, in order to reduce a device operating temperature and to enhance the device's thermal performance, traditional cooling methods such as the use of a heat sink, or cooling plate, have been implemented.

The thermally conductive heat sink conducts heat generated by the power device away from the component, thereby helping regulate the operating temperature of the component. Often the heat sink is manufactured from a thermally and electrically conductive metallic material that also provides mechanical support for the electronic device and circuit substrate. As circuit substrates typically are poor conductors of heat, the power device is typically secured directly to the heat sink.

One method employed to secure a device to a heat sink is a mechanical clip that is screwed, at one end, into the heat sink. A second end of the clip is disposed on top of the power device and applies pressure to the power device in order to mechanically secure the device to the heat sink. However, assembly of such a clip is a mechanically intensive process and the securing of a power device to a heat sink merely by virtue of pressure provides a sub-optimal thermal path to the heat sink.

A more thermally efficient method for securing a power device to a heat sink is to indirectly solder bond the component to the heat sink. Solder will not bond directly to thermally conductive metallic materials, such as aluminum, that are commonly used to manufacture heat sinks. Therefore methods have been developed to indirectly bond a power device to the heat sink. One such technique employs a non-conductive organic laminate material as an interface layer, or pad, between the component and the heat sink as is described in U.S. Pat. No. 6,165,612, hereby incorporated by reference herein in its entirety. However, most organic laminate materials have very limited thermal conductivity. For example, the Bergquist T-clad material has a thermal conductivity of 3 watts/meter·° C. Adhesives are then used to secure the component to the laminate and the laminate to the heat sink. This limits the use of such materials in high power device applications where several hundreds of watts of power may need to be dissipated in a short period of time.

Another technique for bonding a power device to a heat sink employs an inorganic oxide layer that is used to bond a solderable metal, typically copper, to a thermally conductive interface layer or pad, such as alumina or beryllium oxide. The inorganic oxide layer is grown on the interface layer and facilitates the affixing of a copper layer on top of the interface layer. The power device can then be soldered to the copper layer, and thereby to the interface layer. However, a non-electrically conductive oxide layer is normally obtained through high temperature processes such as direct bond copper (DBC) or active metal brazing (AMB) that may involve temperatures well in excess of 1000° C.

In addition, the cost of processing an inorganic structure such as DBC or AMB is high, typically about $1 per square inch. Furthermore, in order to then attach the thermally conductive interface layer to the heat sink, the pad must be mechanically attached to the heat sink or another interface material, such an organic adhesive, must be used. This adds further cost to the process of securing the component to the heat sink and increases the overall thermal resistance between the component and the heat sink. Also, beryllium oxide is a high cost hazardous substance that imposes safety constraints on a design and manufacturing process and further creates disposal problems.

Therefore, a need exists for a method and apparatus for securing a power device to a heat sink, which method and apparatus are of lower cost than prior art methods, may be employed in high volume production, results in a low resistance thermal path between the component and the heat sink, and does not involve a hazardous substance, thereby allowing for the dissipation by the component of large amounts of power in short intervals of time.

DETAILED DESCRIPTION OF THE INVENTION

Figure 1:
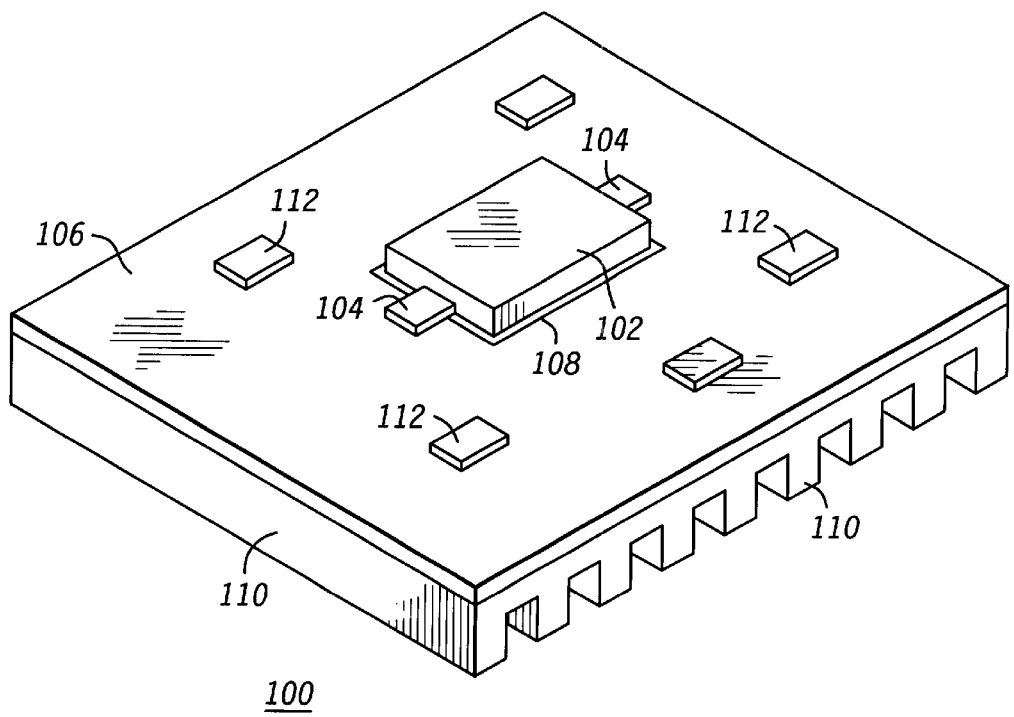
FIG. 1 is an isometric perspective of a side view of an electronic module in accordance with an embodiment of the present invention.

To address the need for a method and apparatus for securing a power device to a heat sink, which method and apparatus are of lower cost than prior art methods, may be employed in high volume production, and result in a low resistance thermal path between the component and the heat sink, thereby allowing for the dissipation by the component of large amounts of power in short intervals of time, an electronic control module is provided wherein a power device is secured to a rigidizer, or heat spreader, such that a thermally conductive path is created for a conduction of heat from the power device to the rigidizer. A thermally conductive and electrically insulated interface, preferably anodized aluminum, is disposed between the device and the rigidizer and is solder bonded to each of the device and the rigidizer, facilitating the creation of a thermal path from the device to the rigidizer. In order to solder bond the device to the interface and the interface to the rigidizer, solderable coatings are respectively applied to surfaces of the interface and a surface of the rigidizer.

Generally, one embodiment of the present invention encompasses a method for securing an electronic device to a heat spreader. The method includes steps of applying a first solderable, thermally conductive coating to a first surface of a thermally conductive metallic interface layer and applying a second solderable, thermally conductive coating to a second surface of the interface layer, placing the electronic device on the first coating, and solder bonding the electronic device to the first coating. The method further includes steps of applying a third solderable, thermally conductive coating to a surface of the heat spreader, placing the interface layer, via the second coating, on the heat spreader to which the coating has been applied, and solder bonding the interface layer to the heat spreader.

Another embodiment of the present invention encompasses an apparatus for securing a power device to a heat spreader. The apparatus includes a power device, a heat spreader, and a metallic interface disposed between the power device and the heat spreader. The metallic interface includes a first surface disposed adjacent to the power device and a second surface disposed adjacent to the surface of the heat spreader, wherein a first solderable, thermally conductive coating is applied to the first surface of the metallic interface and a second solderable, thermally conductive coating is applied to the second surface of the metallic interface. The heat spreader includes a thermally conductive metal and further includes a surface for disposition of the power device, wherein the heat spreader surface is coated with a third solderable, thermally conductive coating. The power device is solder bonded to the top surface of the metallic interface via the first coating, and the metallic interface is solder bonded to the heat spreader via the second and third coatings.

Yet another embodiment of the present invention encompasses an electronic control module that includes a rigidizer manufactured from a thermally conductive metal, a circuit substrate disposed adjacent to a surface of the rigidizer having an aperture for insertion of a power device, a power device disposed in the aperture of the circuit substrate, and a metallic interface disposed in the aperture and further disposed between the power device and the rigidizer. The metallic interface includes a first surface disposed adjacent to the power device and a second surface disposed adjacent to the surface of the rigidizer. A solderable, thermally conductive coating is applied to each of the first surface of the metallic interface and the second surface of the metallic interface. A solderable, thermally conductive coating is further applied a section of the surface of the rigidizer disposed adjacent to the metallic interface. The power device is solder bonded to the first surface of the metallic interface and the second surface of the metallic interface is solder bonded to the rigidizer.

The present invention may be more fully described with reference to FIGS. 1–3. FIG. 1 is an isometric perspective of an electronic module 100, such as an engine mounted electronic control module for a vehicular engine, in accordance with an embodiment of the present invention. Electronic module 100 includes a power device 102, a circuit substrate 106, and a rigidizer 110. Rigidizer 110 is an electrically and thermally conductive material, such as aluminum, that functions as a heat spreader for power device 102 and circuit substrate 106 and provides mechanical support for the power device and the circuit substrate. Circuit substrate 106 includes an aperture 108 in the substrate for the disposition of power device 102, thereby facilitating a securing of the power device to rigidizer, or heat spreader, 110. Power device 102 is any discrete electronic component or device that can be used in an electronic circuit and that dissipates a significant amount of energy in the form of heat, such as, for example, a power amplifier, a high power switching device, or a high power resistor.

Figure 2:
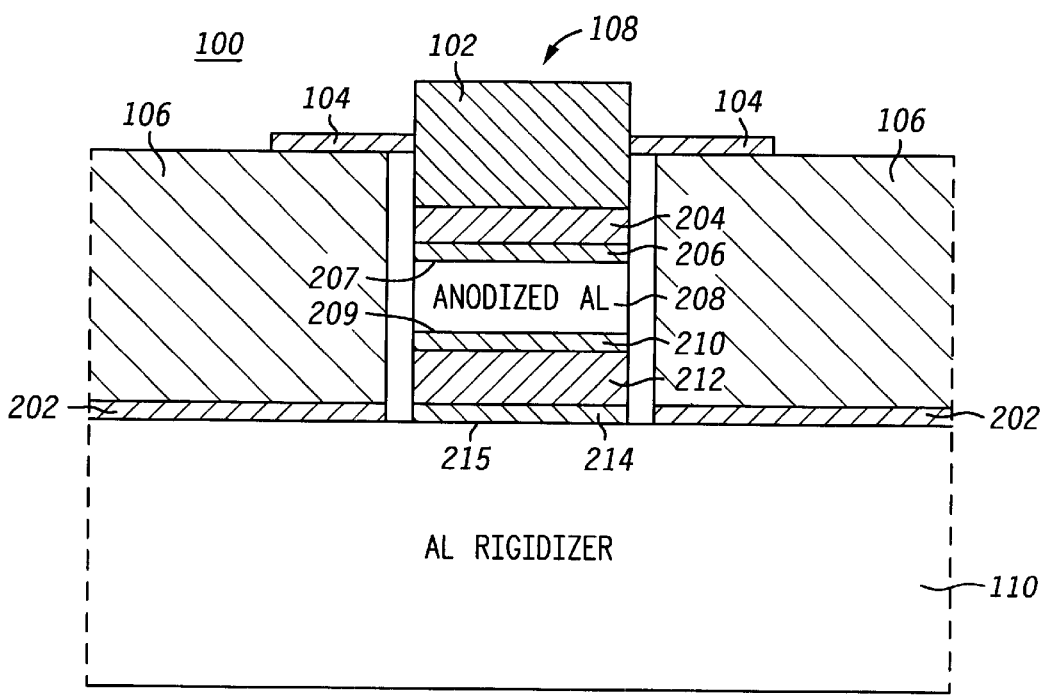
FIG. 2 is a cross-section of a partial side view of the electronic module of FIG. 1 in accordance with an embodiment of the present invention.

Referring now to FIGS. 1 and 2, power device 102 is disposed in aperture 108 and is secured to a surface 215 of rigidizer 110. Power device 102 also includes multiple electronically conductive connectors 104 (two shown), such as flanges, leads, or wires, that are mounted on a surface of circuit substrate 106 and provide an electrical connection between device 102 and circuit substrate 106. Typically, circuit substrate 106 has a number of other electronic components 112 mounted on the surface of the circuit substrate. These electronic components 112 are electrically connected to each other, and to power device 102, through a number of lands (not shown) and traces (not shown) printed on the surface and on internal layers of circuit substrate 106.

Circuit substrate 106 is a printed circuit board manufactured from any one of a number of materials known to one of ordinary skill in the art, such as epoxy glass, FR4, polyimide, or a ceramic material, such as alumina, suitable for high power applications. Those who are of ordinary skill in the art realize that the composition of circuit substrate 106 is not critical to the present invention and that other materials may be used herein without departing from the spirit and scope of the present invention. Circuit substrate 106 is mechanically secured to the surface of rigidizer 110. Many methods are known for securing circuit substrate 106 to the surface 215 of rigidizer 110, such as by use of an adhesive or by use of mechanical fasteners such as screws, and those who are of ordinary skill in the art realize that any such method may be used herein without departing from the spirit and scope of the present invention.

Rigidizer 110 provides a thermally conductive path for heat generated by power device 102 and circuit substrate 106 and conductively transferred to the rigidizer during operation of module 100. Rigidizer 110 further provides a mechanical support for device 102 and substrate 106. In order for rigidizer 110 to provide a desired level of thermal conductivity and further to provide the mechanical support necessary for a module located in a harsh physical environment such as an automobile engine, rigidizer 110 is typically manufactured from a thermally conductive metallic material, such as aluminum, that is also rigid enough to provide a rigid mechanical support. As circuit substrates, such as substrate 106, typically are poor conductors of heat, power device 102 is secured to rigidizer 110. However, solder, which is typically used to provide an optimal thermal contact for a power device, such as power device 102, and to mechanically secure the power device, will not bond directly to the materials typically used to manufacture rigidizer 110.

FIG. 2 is a cross-section of a partial side view of electronic module 100 in accordance with an embodiment of the present invention. In order to provide a solderable, thermally conductive interface between power device 102 and rigidizer 110, a thermally conductive and electrically insulated substrate 208, preferably anodized aluminum, is used as an interface layer, or pad, between the power device and the rigidizer. Anodized aluminum is an excellent thermal conductor. However, anodized aluminum is not practically solderable. Therefore, solderable, thermally conductive coatings 206, 210 are respectively applied to each of a first, or upper, surface 207 and a second, or lower, surface 209 of anodized aluminum interface 208. A solderable, thermally conductive coating 214 is further applied to a section of surface 215 of rigidizer 110 to facilitate the securing of power device 102 to the rigidizer.

In one embodiment of the present invention, coatings 206, 210, and 214 may each be a low temperature processed organic material, such as Dynaloy 350 from Dynaloy, Inc., that is cured by being exposed to a temperature of approximately 150° C. for approximately 10 minutes. In another embodiment of the present invention, coatings 206, 210, and 214 may each be a high temperature processed glass binder filled ink, such as Ferro 3350 from Ferro Corporation, that is fired by being exposed to a temperature of approximately 600° C. for approximately 5 minutes. By applying a solderable coating to surfaces 207 and 209 of interface 208 and to surface 215 of rigidizer 110, interface 208 and rigidizer 110 become solderable, thereby permitting securing of power device 102 to interface 208 and to rigidizer 110, and permitting assembly of electronic module 100, by a conventional soldering process.

A first solder layer 204 is then used to bond power device 102 to the first surface 207 of anodized aluminum interface 208 via coating 206. A second solder layer 212 is used to bond the second surface 209 of anodized aluminum interface 208 to rigidizer 110 via coatings 210 and 214. As is shown in FIG. 2, circuit substrate 106 is also secured to surface 215 of rigidizer 110 by an adhesive 202, preferably a heat curable adhesive although those who are of ordinary skill in the art realize that any one of a number of adhesives may be used to secure substrate 106 to rigidizer 110. In another embodiment of the present invention, circuit substrate 106 may be secured to rigidizer 110 by a mechanical fastener such as a screw. By solder bonding a thermally conductive and electrically insulated interface 208 to power device 102, and solder bonding rigidizer 110 to interface 208, and thereby to power device 102, a thermally conductive path is created for a conduction of heat from the power device to the rigidizer via a low cost, nonhazardous interface layer. Furthermore, after coatings 206, 108, and 214 have been respectively applied to interface 208 and rigidizer 110, power device 102 may be secured to rigidizer 110 by conventional soldering techniques, permitting an automated assembly of electronic module 110.

Figure 3:
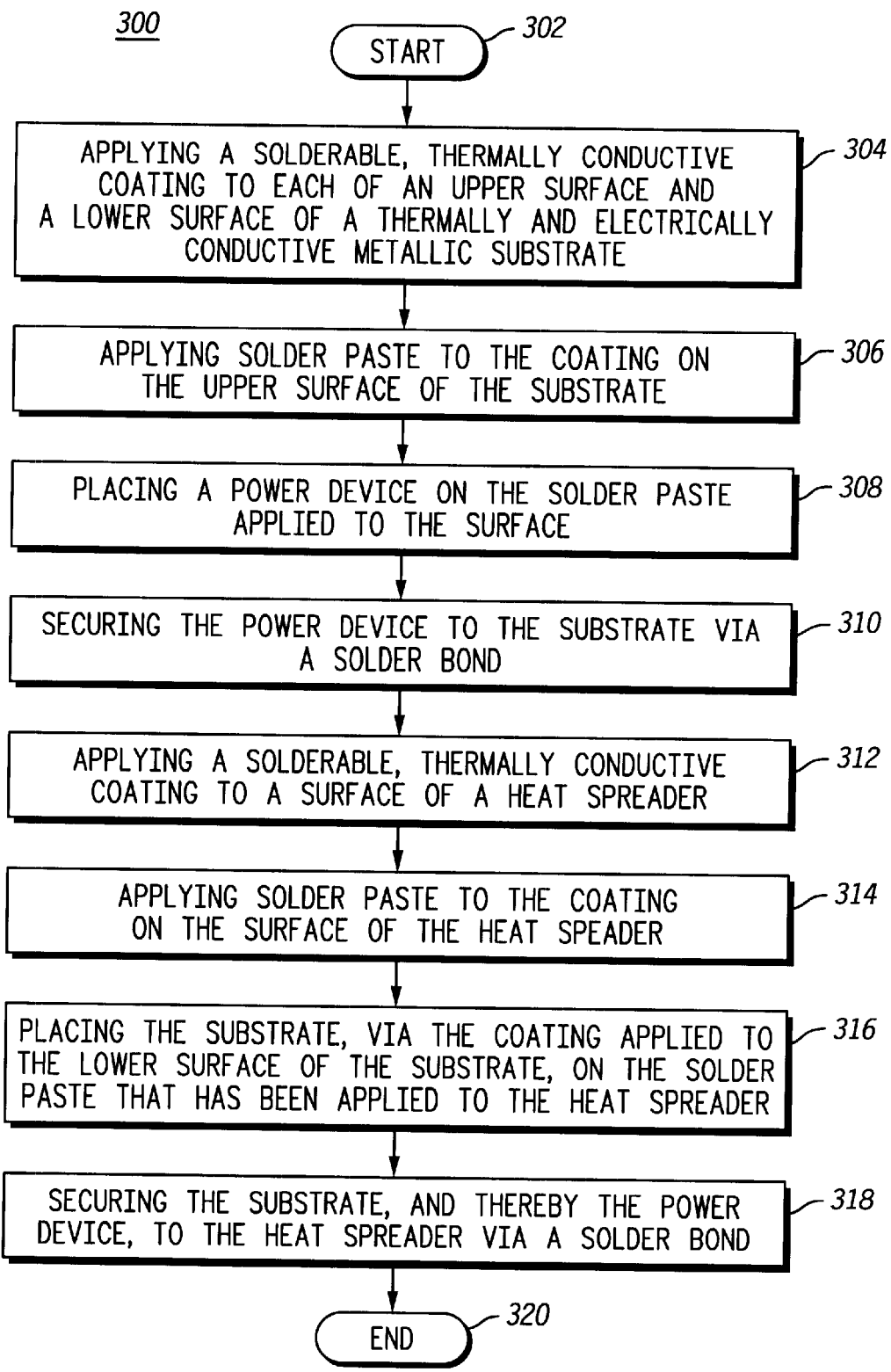
FIG. 3 is a logic flow diagram of the process of securing the power device of FIG. 1 to the heat sink of FIG. 1 in accordance with an embodiment of the present invention.

FIG. 3 is a logic flow diagram 300 of a process of securing power device 102 to rigidizer 110 in accordance with an embodiment of the present invention. The process starts (302) by applying (304), by curing or firing, a solderable, thermally conductive coating 206, 210 to each of a first, upper surface 207 and a second, lower surface 209 of a thermally conductive metallic interface 208. Solder paste 204 is then applied (306), preferably screened, onto the coating 206 that was applied to first surface 207 of interface 208. Power device 102 is disposed (308) in contact with solder paste 204, preferably being placed on solder paste 204 by an automated pick-and-place machine, and is secured (310) to interface 208 by a solder bond, preferably by reflowing solder paste 204 in a reflow oven.

A solderable, thermally conductive coating 214 is also applied (312), by curing or firing, to a surface 215 of rigidizer 110 to which power device 102 is to be secured. Solder paste 212 is applied (314), preferably screened, onto coating 214. Interface 208 is then placed (316) on solder paste 212, preferably being placed on solder paste 212 by an automated pick-and-place machine, such that the coating 210 applied to second surface 209 of the interface is disposed in contact with solder paste 212. In another embodiment of the present invention, solder paste 212 may be applied to coating 210 on second surface 209 of interface 208 and interface 208 may then placed on rigidizer 110 such that the coating 214 applied to surface 215 of the rigidizer is disposed in contact with solder paste 212. Interface 208 is then secured (318) to rigidizer 110 by a solder bond, preferably by reflowing solder paste 212 in a reflow oven, and the logic flow ends (320). By using an automated pick-and-place machine to place power device 102 on interface 208 and to place interface 208 on rigidizer 110, and by using conventional soldering techniques to solder bond power device 102 to interface 208 and interface 208 to rigidizer 110, the process of securing power device 102 to a coated substrate, and thereby to a coated rigidizer 110, may be fully automated.

The steps of process 300 need not be performed in any particular order. In one embodiment of the present invention, coatings 206 and 210 are respectively applied to surfaces 207 and 209 of interface 208, solder paste 204 is applied to power device 102 or to coating 206, and power device 102 is solder bonded to interface 208 to produce a first subassembly. Coating 214 and solder paste 212 are then applied to surface 215 of rigidizer 110 to produce a second subassembly, and the first subassembly is solder bonded to the second subassembly via solder paste 212 and coating 210. In another embodiment of the present invention, solder paste 212 may be applied to coating 210 rather than coating 214, and the first subassembly may be solder bonded to the second subassembly via solder paste 212 and coating 214.

In yet another embodiment of the present invention, interface 208 may be solder bonded to rigidizer 110 prior to the securing of power device 102 to interface 208. In such an embodiment, coating 214 may be applied to surface 215 of rigidizer 110, coatings 206 and 210 may be respectively applied to surfaces 207 and 209 of interface 208, and solder paste 212 may then be applied to either coating 214 of rigidizer 110 or to coating 210 of interface 208. Interface 208 is then secured to rigidizer 110 by reflowing solder paste 212. Solder paste 204 may be applied to either power device 102 or to coating 206 on surface 207 of interface 208, and then power device 102 is secured to interface 208 by a reflow of solder paste 204. In still another embodiment of the present invention, power device 102 may be solder bonded to interface 208 and interface 208 may be solder bonded to rigidizer 110 in a single reflow rather then as the product of a reflow of two subassemblies.

In sum, an electronic control module 100 is provided wherein a power device 102 is secured to a rigidizer, or heat spreader, 110 such that a thermally conductive path is created for a conduction of heat from the power device to the rigidizer. The use of thermally conductive and electrically insulated interface 208 between device 102 and rigidizer 110, and the solder bonding of the device to the interface and the interface to the rigidizer, facilitates the creation of the thermally conductive path and the use of a fully automated assembly process. In order to solder bond the device to the interface and the interface to the rigidizer, thermally conductive solderable coatings 206, 210, 214 are respectively applied to each of surfaces 207 and 209 of interface 208 and surface 215 of rigidizer 110. By using an anodized aluminum interface, the thermal resistance from the power device to the bottom of the interface is approximately 0.8° C./W (degrees centigrade per watt) and the DC (direct current) breakdown voltage from the power device to the heat sink is in the order of 800 V (volts), at a cost of approximately \$0.20 per $inch^2$, resulting in a lower thermal resistance at a lower cost than the prior art.

While the present invention has been particularly shown and described with reference to particular embodiments thereof, it will be understood by those skilled in the art that various changes may be made and equivalents substituted for elements thereof without departing from the spirit and scope of the invention. In addition, many modifications may be made to adapt a particular situation or material to the teachings of the invention without departing from the essential scope thereof. Therefore, it is intended that the invention not be limited to a particular embodiments disclosed herein, but that the invention will include all embodiments falling within the scope of the appended claims.

What is claimed is:

1. A method for securing an electronic device to a heat spreader comprising steps of:
    applying a first solderable, thermally conductive coating to a first surface of a thermally conductive metallic interface layer and applying a second solderable, thermally conductive coating to a second surface of the interface layer;
    placing the electronic device on the first coating;
    solder bonding the electronic device to the first coating;
    applying a third solderable, thermally conductive coating to a surface of the heat spreader;
    placing the interface layer, via the second coating, on the heat spreader to which the coating has been applied; and
    solder bonding the interface layer to the heat spreader.

2. The method of claim 1, wherein the step of solder bonding the electronic device to the first coating comprises steps of:
    applying a solder paste to the electronic device;
    placing the electronic device on the metallic interface layer such that the solder paste is disposed in contact with the first coating; and
    solder bonding the electronic device to the first coating.

3. The method of claim 1, wherein the step of solder bonding the electronic device to the first coating comprises steps of:
    applying a solder paste to the first coating;
    placing the electronic device on the metallic interface layer such that the electronic device is disposed in contact with the solder paste applied to the first coating; and
    solder bonding the electronic device to the first coating.

4. The method of claim 1, wherein the step of solder bonding the metallic interface layer to the heat spreader comprises steps of:
    applying a solder paste to the second coating;
    placing the interface layer on the heat spreader such that the solder paste is disposed in contact with the coating applied to the surface of the interface layer; and
    solder bonding the second coating to the heat spreader.

5. The method of claim 1, wherein the step of solder bonding the metallic interface layer to the heat spreader comprises steps of:
    applying a solder paste on the coating applied to the surface of the heat spreader;
    placing the interface layer on the heat spreader such that the second coating is disposed in contact with the solder paste that has been applied to the coating on the surface of the interface layer; and
    solder bonding the second coating to the heat spreader.

6. The method of claim 1, wherein the metallic interface layer comprises a metallic material with a non-electrically conductive coating.

7. The method of claim 6, wherein the metallic interface layer is anodized. aluminum.

8. The method of claim 1, wherein at least one coating of the first, second and third coatings is a plating comprising a low temperature organic material comprising silver or copper or both silver and copper.

9. The method of claim 1, wherein at least one coating of the first, second and third coatings is a high temperature glass binder filled ink comprising silver or copper or both silver and copper.

10. An apparatus for securing a power device to a heat spreader comprising:
    a power device;
    a metallic interface disposed between the power device and the heat spreader, wherein the metallic interface comprises a first surface disposed adjacent to the power device and a second surface disposed adjacent to the surface of the heat spreader, wherein a first solderable, thermally conductive coating is applied to the first surface of the metallic interface and a second solderable, thermally conductive coating is applied to the second surface of the metallic interface;
    a heat spreader comprising a thermally conductive metal and further comprising a surface for disposition of the power device, wherein the heat spreader surface is coated with a third solderable, thermally conductive coating; and
    wherein the power device is solder bonded to the top surface of the metallic interface via the first coating, and wherein the metallic interface is solder bonded to the heat spreader via the second and third coatings.

11. The apparatus of claim 10, wherein the metallic interface comprises a metallic material with a non-electrically conductive coating.

12. The apparatus of claim 11, wherein the metallic interface is anodized aluminum.

13. The apparatus of claim 10, wherein at least one coating of the first, second, and third coatings is a low temperature organic material containing silver or copper or both silver and copper.

14. The apparatus of claim 10, wherein at least one coating of the first, second, and third coatings is a high temperate glass binder filled ink containing silver or copper or both silver and copper.

15. An electronic control module comprising:
    a rigidizer manufactured from a thermally conductive metal;
    a circuit substrate disposed adjacent to a surface of the rigidizer having an aperture for insertion of a power device;
    a power device disposed in the aperture of the circuit substrate;
    a metallic interface disposed in the aperture and further disposed between the power device and the rigidizer, wherein the metallic interface comprises a first surface disposed adjacent to the power device and a second surface disposed adjacent to the surface of the rigidizer, when a solderable, thermally conductive coating is applied to each of the first surface of the metallic interface and the second surface of the metallic interface, wherein a solderable, thermally conductive coating is applied to a section of the surface of the rigidizer disposed adjacent to the metallic interface, wherein the power device is solder bonded to the first surface of the metallic interface, and wherein the second surface of the metallic interface is solder bonded to the rigidizer.

* * * * *